United States Patent
Takano et al.

(10) Patent No.: US 12,078,763 B2
(45) Date of Patent: Sep. 3, 2024

(54) RADIATION ANALYSIS SYSTEM, CHARGED PARTICLE BEAM SYSTEM, AND RADIATION ANALYSIS METHOD

(71) Applicant: Hitachi High-Tech Corporation, Tokyo (JP)

(72) Inventors: Akira Takano, Tokyo (JP); Keiichi Tanaka, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 188 days.

(21) Appl. No.: 17/917,200

(22) PCT Filed: Apr. 30, 2020

(86) PCT No.: PCT/JP2020/018258
§ 371 (c)(1),
(2) Date: Oct. 5, 2022

(87) PCT Pub. No.: WO2021/220458
PCT Pub. Date: Nov. 4, 2021

(65) Prior Publication Data
US 2023/0161053 A1 May 25, 2023

(51) Int. Cl.
*G01T 1/16* (2006.01)
*G01N 23/2251* (2018.01)

(52) U.S. Cl.
CPC ....... *G01T 1/1606* (2013.01); *G01N 23/2251* (2013.01); *G01N 2223/07* (2013.01); *G01N 2223/418* (2013.01); *G01N 2223/507* (2013.01)

(58) Field of Classification Search
CPC ......... G01T 1/16; G01T 1/1606; G01T 1/247; G01T 1/26; G01N 23/2251;
(Continued)

(56) References Cited

U.S. PATENT DOCUMENTS

| 2014/0048717 A1 | 2/2014 | Tanaka et al. |
| 2016/0209525 A1 | 7/2016 | Tanaka et al. |

FOREIGN PATENT DOCUMENTS

| JP | 2009-271016 A | 11/2009 |
| JP | 2014-38074 A | 2/2014 |
| JP | 2016-133411 A | 7/2016 |

OTHER PUBLICATIONS

International Search Report (PCT/ISA/210) issued in PCT Application No. PCT/JP2020/018258 dated Jul. 14, 2020 with English translation (five (5) pages).

(Continued)

*Primary Examiner* — Jurie Yun
(74) *Attorney, Agent, or Firm* — Crowell & Moring LLP

(57) ABSTRACT

This radiation analysis system comprises a transition edge sensor that detects radiation, a current detection mechanism that detects a current flowing in the transition edge sensor, and a computer sub-system that processes a current detection signal from the current detection mechanism. The computer sub-system is characterized by executing: a process for calculating a baseline current of the current detection signal; a process for calculating a wave height value of a signal pulse produced in the detection signal when the transition edge sensor has detected radiation; a process for acquiring correlation data based on the baseline current and the wave height value; and a process for correcting the wave height value of the signal pulse, or an energy value calculated from the wave height value, on the basis of the correlation data and the baseline current from before production of the signal pulse when radiation having unknown energy is detected.

14 Claims, 11 Drawing Sheets

(58) Field of Classification Search
CPC .......... G01N 23/2252; G01N 2223/07; G01N 2223/418; G01N 2223/507; H01J 37/244; H01J 2237/2442; H01J 2237/24495
See application file for complete search history.

(56) References Cited

OTHER PUBLICATIONS

Japanese-language Written Opinion (PCT/ISA/237) issued in PCT Application No. PCT/JP2020/018258 dated Jul. 14, 2020 (three (3) pages).

RADIATION ANALYSIS SYSTEM, CHARGED PARTICLE BEAM SYSTEM, AND RADIATION ANALYSIS METHOD

TECHNICAL FIELD

The present invention relates to a radiation analysis system, a charged particle beam system, and a radiation analysis method.

BACKGROUND ART

There is an energy dispersive X-ray detector (Energy Dispersive Spectroscopy, hereinbelow referred to as "EDS") and a wavelength dispersive X-ray detector (Wavelength Dispersive Spectroscopy, hereinbelow referred to as "WDS") as radiation analyzers capable of discriminating energy of a radiation. The EDS converts energy of an X-ray taken into a detector to an electric signal in the detector, and calculates energy based on the magnitude of the electrical signal. The WDS monochromatizes the X-ray using a spectrometer and detects the monochromatic X-ray using a proportional counter or the like.

Widely used as the EDS are semiconductor detectors such as a silicon lithium detector, a silicon drift detector, and a germanium detector. For example, the silicon lithium or silicon drift detector is used for an elemental analyzer in an electron microscope, which can detect energy in a range of about 0.1 keV to 20 keV. However, because its performance depends on a bandgap of the silicon used in the detector (about 1.1 eV), it is difficult to improve an energy resolution to about 120 eV or lower, the energy resolution being more than ten times inferior to that of the WDS.

That the energy resolution being one of indices indicative of the performance of the X-ray detector is, for example, 120 eV means that the energy can be detected with an uncertainty of 120 eV when the X-ray detector is irradiated with an X-ray. The smaller the uncertainty is, the higher the energy resolution is. In a case of detecting an X-ray consisting of two adjacent spectra with about 20 eV difference, it is possible to separate two peaks as long as the energy resolution is about 20 eV to 30 eV.

As an alternative to the semiconductor detector used for the EDS, a superconductive X-ray analyzer of the energy dispersive type and also having the energy resolution equivalent to that of the WDS has been gathering attention. Among superconductive X-ray analyzers, a detector that includes a superconductive transition edge sensor (Transition Edge Sensor, hereinbelow referred to as "TES") is a highly sensitive calorimeter using a sudden change in resistance value between superconductivity and normal conductivity of a thin metal film (e.g., a change in resistance value due to a temperature change of a few mK is 100 mΩ). The TES is also referred to as a microcalorimeter.

The TES analyzes a sample by detecting the temperature change of the TES which occurs when a fluorescent X-ray or a characteristic X-ray generated by exposure of a radiation such as a primary X-ray or a primary electron beam enters the TES. The TES has an energy resolution higher than that of the semiconductor detector, for example, the energy resolution of 10 eV or lower with respect to an X-ray of 5.9 keV.

Although it is significant to maintain the baseline current flowing through the TES constant in order to achieve the high energy resolution of the TES, it is technically difficult to make variation of the baseline current zero, and therefore there are proposed various sensitivity correction methods.

For example, Patent Literature 1 discloses an X-ray analyzer including "a sensitivity correction operation unit 7 that corrects a current detected by a current detection mechanism 4 or a peak value measured by a pulse height analyzer 5 depending on a variation width in a case in which the baseline current varies out of a default value" (see abstract in Patent Literature 1).

Patent Literature 2 discloses a radiation analyzer including "a sensitivity correction operation unit 7 that corrects sensitivity of a TES 1 from the relation between an output from a first heater 20 acquired in advance and a peak value measured by a pulse height analyzer 5" (see abstract in Patent Literature 2).

CITATION LIST

Patent Literature

Patent Literature 1: Japanese Unexamined Patent Application Publication No. 2009-271016
Patent Literature 2: Japanese Unexamined Patent Application Publication No. 2014-038074

SUMMARY OF INVENTION

Technical Problem

However, with the X-ray analyzer according to Patent Literature 1, it is required to constantly monitor the baseline current and acquire additional correction data every time the baseline current flowing through the TES varies.

The radiation analyzer according to Patent Literature 2 acquires correlation characteristics between the output of the heater and the sensitivity of the TES in advance and then corrects the peak value of the signal pulse of the TES using the sensitivity of the TES corresponding to the output of the heater when acquiring the signal pulse of the TES in an actual measurement. However, since the output of the heater has slow responsiveness, it is not possible to acquire a high energy resolution when the baseline current varies fast.

Therefore, the present disclosure provides a radiation analysis system that does not need to acquire additional correction data and that can acquire a stably high energy resolution.

Solution to Problem

A radiation analysis system according to the present disclosure includes: a superconductive transition edge sensor that detects a radiation; a current detection mechanism that detects a current flowing through the superconductive transition edge sensor; and a computer subsystem that processes a detection signal of the current from the current detection mechanism, wherein the computer subsystem performs a process of calculating a baseline current of the detection signal of the current, a process of calculating a peak value of a signal pulse generated in the detection signal when the superconductive transition edge sensor detects the radiation, a process of acquiring correlation data based on the baseline current and the peak value, and a process of correcting the peak value of the signal pulse or an energy value calculated from the peak value on the basis of the baseline current before the signal pulse is generated when a radiation having unknown energy is detected by the superconductive transition edge sensor and the correlation data.

Further features related to the present disclosure will be apparent from the description of the present specification and appended drawings. Moreover, aspects of the present disclosure will be achieved and realized by elements and combinations of various elements as well as the following detailed descriptions and modes of appended claims.

The description in the specification merely presents typical examples, and does not limit the claims or application examples of the present disclosure in any way.

Advantageous Effects of Invention

According to the radiation analysis system in the present disclosure, it is possible to acquire a stably high energy resolution without having to acquire additional correction data.

Other problems, configurations, and effects will become apparent from the following description of embodiments.

DESCRIPTION OF EMBODIMENTS

In the following, embodiments of the present disclosure are described with reference to drawings.

Although an example of using a scanning electron microscope as an electron microscope (charged particle beam irradiation subsystem) in a charged particle beam system of the embodiments will be described, it is merely an example of a technology disclosed herein and the technology of the present disclosure is not limited to the embodiments described below. In the present disclosure, the electron microscope should include a wide variety of devices that takes an image of a sample using an electron beam. For example, the technology of the present disclosure can also be applied to a scanning electron microscope, a transmission electron microscope, and a sample processing device or a sample analyzer equipped with the scanning electron microscope.

Moreover, examples of an X-ray analyzer using the electron beam include an inspection device, a review device, a pattern measurement device, and the like using the scanning electron microscope. The X-ray analyzer using the electron microscope should include a system in which respective devices including the above-described electron microscope are connected via a network and an apparatus combining the respective devices described above.

As used herein, a "sample" includes a wide variety of objects to be observed and analyzed. For example, the "sample" includes a semiconductor wafer formed of silicon or the like, a high-performance material such as those used for a lithium battery, a biological sample, and the like.

First Embodiment

<Configuration of Scanning Electron Microscope System>

Figure 1:
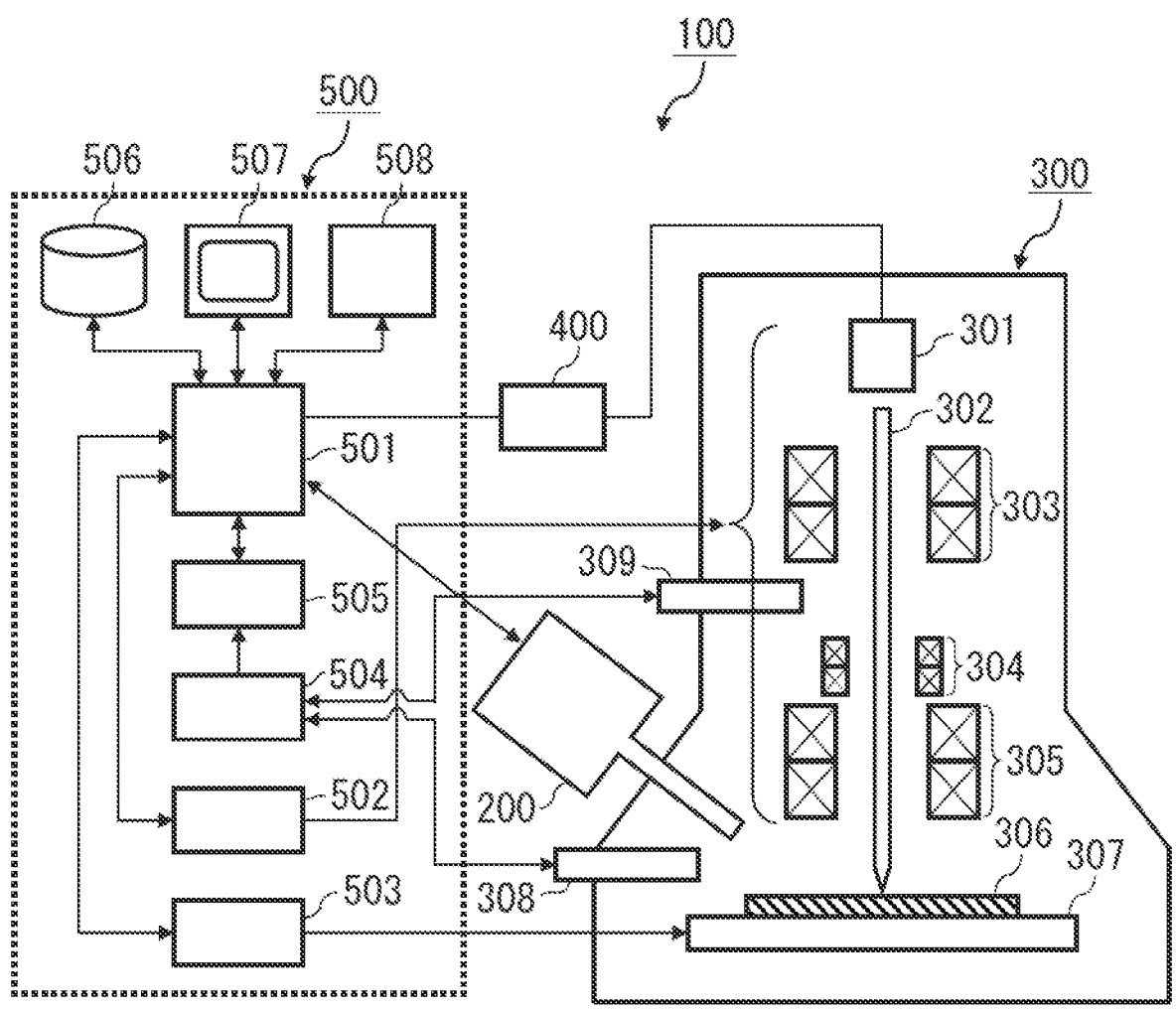
FIG. 1 shows a configuration of a scanning electron microscope system according to a first embodiment.

FIG. 1 shows a configuration of a scanning electron microscope system 100 (charged particle beam system) according to a first embodiment. As shown in FIG. 1, the scanning electron microscope system 100 includes a radiation analysis subsystem 200 (radiation analysis system), a scanning electron microscope 300 (charged particle beam irradiation subsystem), a high voltage power supply 400, and a computer subsystem 500.

The scanning electron microscope 300 includes an electron source 301, a condenser lens 303, a deflection scanning coil 304, an objective lens 305, a sample stage 307, a backscattered electron detector 308, and a secondary electron detector 309.

The computer subsystem 500 is a computer system that controls operations of the scanning electron microscope 300 and the high voltage power supply 400, and includes a total control unit 501, an electron optical system control unit 502, a stage control unit 503, an A/D conversion unit 504, an image operation unit 505, a storage device 506, a display unit 507, and an input device 508.

A sample 306 to be observed is placed on the sample stage 307. The sample stage 307 moves in an X-Y direction on the basis of an instruction signal from the stage control unit 503. Connected to the electron source 301 is the high voltage power supply 400, and a voltage is applied from the high voltage power supply 400 to the electron source 301 on the basis of the instruction signal from the total control unit 501.

An electron beams 302 (charged particle beam) released from the electron source 301 is converged by the condenser lens 303 and the objective lens 305 on the basis of the instruction signal from the electron optical system control unit 502, and scanned over the sample 306 by the deflection scanning coil 304.

By the electron beam 302 falling onto the sample 306, backscattered electrons and secondary electrons are generated from the sample 306. The backscattered electrons reaching the backscattered electron detector 308 and the secondary electrons reaching the secondary electron detector 309 are converted to a current, output to the A/D conversion unit 504, and converted to a digital signal. The image operation unit 505 performs generation of an SEM image and image processing using the digital signal generated by the A/D conversion unit 504.

Connected to the total control unit 501 are the storage device 506, the display unit 507, and the input device 508, and the SEM image generated by the image operation unit 505 is stored in the storage device 506 and displayed on the display unit 507 via the total control unit 501.

The display unit 507 also displays a GUI screen for a user of the scanning electron microscope system 100 to input an instruction. The user sends the instruction to the total control unit 501 via the GUI screen displayed on the display unit 507 by operating the input device 508. The total control unit 501 controls each unit in such a manner as changing an imaging condition or imaging position of the SEM image, changing a detection condition of the radiation analysis subsystem 200, and the like by sending an instruction to the high voltage power supply 400, the electron optical system control unit 502, the stage control unit 503, the image operation unit 505, or the radiation analysis subsystem 200 on the basis of the user input.

The radiation analysis subsystem 200 is a device that can be used as a composition analyzer such as, for example, an electron microscope, an ion microscope, an X-ray microscope, a fluorescent X-ray microscope, and the like. The radiation analysis subsystem 200 detects a characteristic X-ray (radiation) emitted from the sample by irradiation with the electron beam 302, and calculates its energy. Since the characteristic X-ray has energy specific to the element, the radiation analysis subsystem 200 can analyze what element is present at the irradiated position of the electron beam 302 on the sample 306 by generating a spectrum in which the horizontal axis indicates energy and the vertical axis indicates a count of X-rays.

The radiation analysis subsystem 200 is configured to be able to transmit and receive (communicate) the data and the instruction signal to and from the total control unit 501 in the computer subsystem 500, and the result of the elemental analysis by the radiation analysis subsystem 200 is output to the storage device 506 and the display unit 507 via the total control unit 501. The total control unit 501 can also transmit information of the detected element to a data management server (not shown) via the network.

Figure 2:
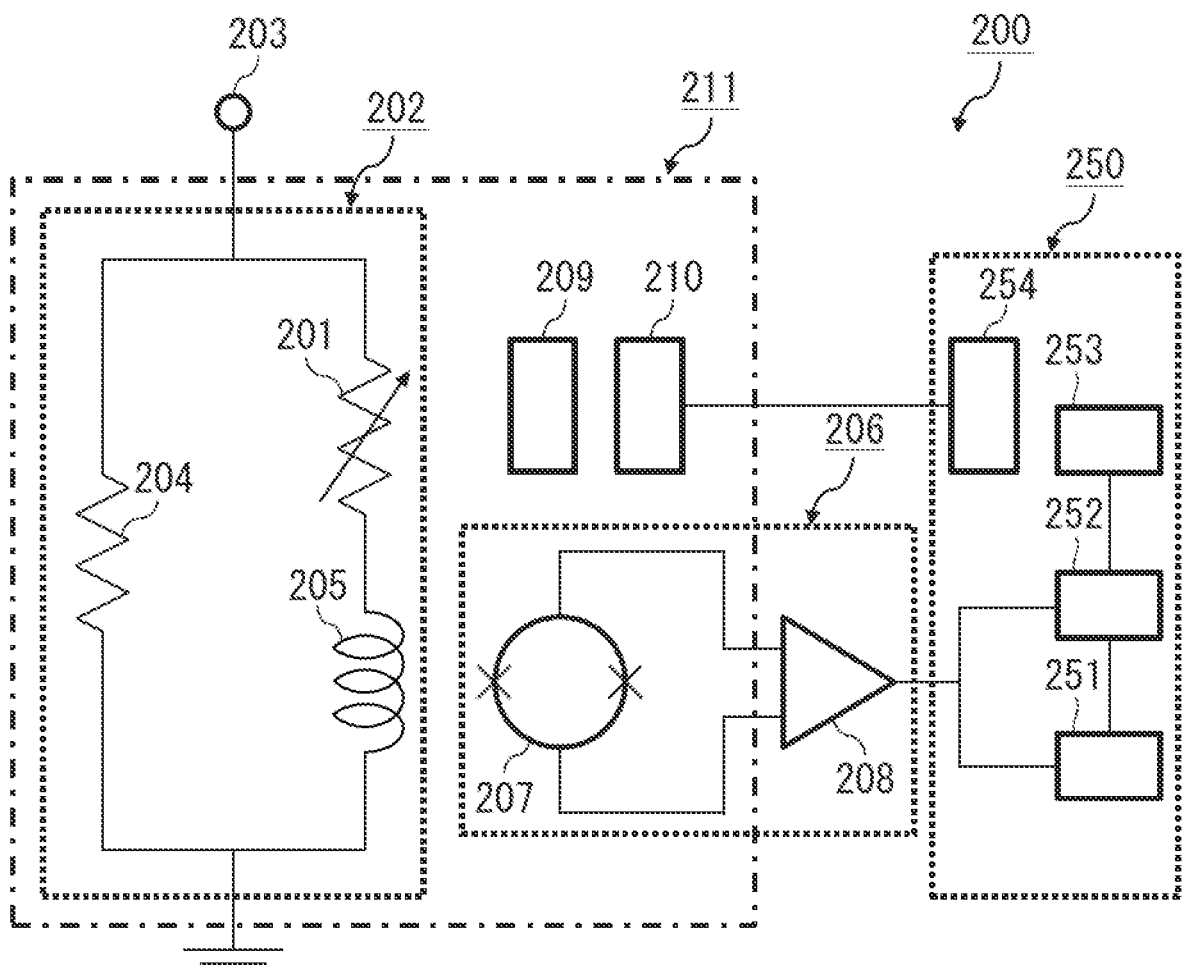
FIG. 2 is a schematic diagram showing a configuration of a radiation analyzer.

FIG. 2 is a schematic diagram showing a configuration of the radiation analysis subsystem 200. As shown in FIG. 2, the radiation analysis subsystem 200 includes a TES 201, a sensor circuit unit 202, a bias current source 203, a current detection mechanism 206, a first thermometer 209, a heater 210, a refrigerator 211, and a computer subsystem 250.

Upon receiving a radiation, the TES 201 detects its energy as a temperature change, and outputs the temperature change as a current signal. Detailed configuration of the TES 201 will be described later. The bias current source 203 applies to the sensor circuit unit 202 a current for artificially driving the sensor circuit unit 202 at a constant voltage. The sensor circuit unit 202 is connected to the TES 201, and includes a shunt resistor 204 and an input coil 205.

The shunt resistor 204 is connected in parallel with the TES 201 and presents a resistance value smaller than that of the TES 201. The input coil 205 is connected to the TES 201 in series. When a bias current is applied from the bias current source 203 to the sensor circuit unit 202, the current is bifurcated at a resistance ratio between the resistance value of the shunt resistor 204 and the resistance value of the TES 201. That is, a voltage value of the TES 201 is determined by the voltage value determined by the current flowing through the shunt resistor 204 and the resistance value of the shunt resistor 204.

The current detection mechanism 206 includes a SQUID amplifier 207 (SQUID: Superconducting Quantum Interference Device, superconducting quantum interference device) and a room temperature amplifier 208. The SQUID amplifier 207 detects a magnetic field generated by the input coil 205, generates an electric signal, and outputs the electric signal to the room temperature amplifier 208. The room temperature amplifier 208 acquires a signal pulse of the current flowing through the TES 201 by amplifying and forming the electric signal output from the SQUID amplifier 207. In this manner, the current detection mechanism 206 can detect an extremely minor change in the current flowing through the TES 201 by using the SQUID amplifier 207. It is to be noted that, although the SQUID amplifier 207 using the input coil 205 and the room temperature amplifier 208 are used as the current detection mechanism 206, other configurations may be employed as long as the change in the current flowing through the TES 201 can be detected.

In FIG. 2, the refrigerator 211 is schematically represented by a region surrounded by a one dot chain line, and it is shown that the TES 201, the sensor circuit unit 202, the SQUID amplifier 207, the first thermometer 209, and the heater 210 are installed inside the refrigerator 211. Moreover, a cold head (not shown in FIG. 2) is installed inside the refrigerator 211, and the first thermometer 209 and the heater 210 are installed in the cold head.

The computer subsystem 250 includes a pulse height analyzer 251, a correction unit 252, a spectrum generation unit 253, and a temperature control unit 254. Although not shown in the figures, the computer subsystem 250 includes a display unit such as a display, a processor (operation circuit) such as a central processing unit (CPU), and a storage device such as a memory for storing a program and the like. Functions of respective modules of the computer subsystem 250 (pulse height analyzer 251, the correction unit 252, the spectrum generation unit 253, and the temperature control unit 254) can be realized by, for example, program processing by the processor. It is to be noted that each module of the computer subsystem 250 may be incorporated into the above-described total control unit 501, or each module may be incorporated into a different personal computer.

The pulse height analyzer 251 receives an input of a detection signal of the current detected by the current detection mechanism 206 and calculates the peak value of the signal pulse of the current flowing through the TES 201. It is to be noted that the "peak value" as used herein includes a wide variety of the signal pulses calculated to improve precision of the analysis. For example, the "peak value" includes a height component of the signal pulse, an integrated value of the signal pulse, the signal pulse convoluted with a filter such as a band filter, and the like.

The correction unit 252 corrects the peak value calculated by the pulse height analyzer 251. Details of correcting the peak value by the correction unit 252 according to the present embodiment will be described later. Moreover, the correction unit 252 receives an input of a detection signal of the current detected by the current detection mechanism 206 and calculates an average value of the baseline current.

The spectrum generation unit 253 generates an energy spectrum of the radiation detected by the TES 201 using the peak value corrected by the correction unit 252. The spectrum generation unit 253 generates the spectrum by repeating an operation of incrementing the count of the peak value by one in a histogram in which the horizontal axis indicates the peak value and the vertical axis indicates the count. Moreover, when data for converting the peak value to the energy is taken into the pulse height analyzer 251, the correction unit 252, or the spectrum generation unit 253 in advance, a histogram in which the horizontal axis indicates the energy and the vertical axis indicates the count can be displayed on the display unit.

The temperature control unit 254 controls the output of the heater 210.

Figure 3:
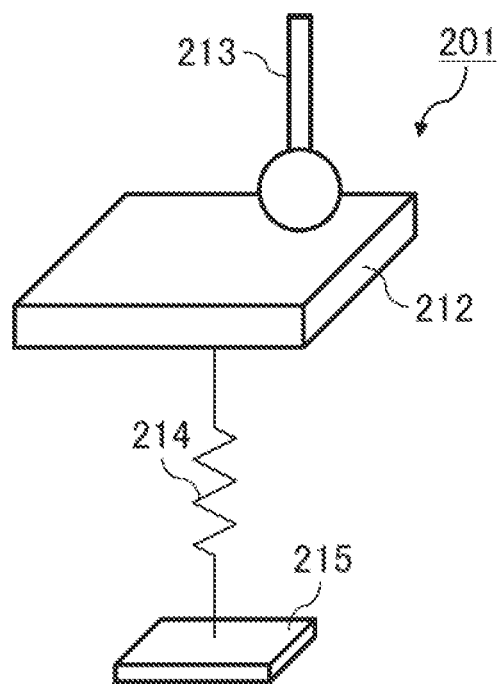
FIG. 3 is a schematic diagram showing a configuration of a TES.

FIG. 3 is a schematic diagram showing a configuration of the TES 201. As shown in FIG. 3, the TES 201 includes an absorber 212, a second thermometer 213, and a membrane 214. The absorber 212 is a metal, a semimetal, a superconductor, or the like for absorbing a radiation such as an X-ray, which is formed of, for example, gold, copper, or bismuth. The second thermometer 213 is formed of the superconductor, and detects heat generated in the absorber 212 as the temperature change. The second thermometer 213 is formed of a stack including two layers of titanium and gold, for example. The membrane 214 is formed of silicon nitride, for example. The membrane 214 loosely thermally connects between the second thermometer 213 and the cold head 215, and controls the flow of the heat flowing to the cold head 215.

Figure 4:
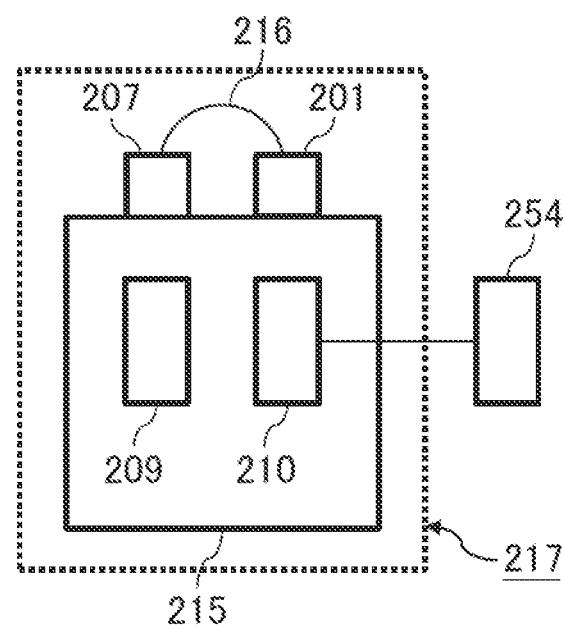
FIG. 4 is a schematic diagram showing a configuration of a part of the radiation analyzer.

FIG. 4 is a schematic diagram showing a configuration of a part of the radiation analysis subsystem 200. As shown in FIG. 4, the TES 201, the shunt resistor 204 (not shown in FIG. 4), and the SQUID amplifier 207 are provided at a tip of the cold head 215. A substrate having the TES 201 and a substrate having the SQUID amplifier 207 are connected with a superconductive wiring 216. The cold head 215 is surrounded by a heat shield 217.

Provided inside the cold head 215 are the first thermometer 209 that monitors temperature of the cold head 215 and the heater 210. A resistive thermometer can be used as the first thermometer 209, and the material of the sensor may be, for example, a semiconductor such as germanium, a superconductor, or a metal oxide such as ruthenium oxide. The first thermometer 209 has a resistance value that changes in accordance with the temperature of the cold head 215. Accurate temperature information of the cold head 215 can be acquired by correlating the temperature and the electric signal output from the first thermometer 209 and storing them in the temperature control unit 254 in advance.

The cold head 215 is cooled by the refrigerator 211 to 50 mK-400 mK. Specifically, the TES 201 needs to be cooled to a temperature lower than the temperature at which the super conductive transition occurs. Examples of the means of cooling the refrigerator 211 include a dilution refrigerator and an insulated demagnetized refrigerator (Adiabatic Demagnetization Refrigerator, hereinbelow referred to as "ADR"). The former employs a technology of cooling using enthalpy change which occurs when 3He melts from a dense phase into a dilute phase in a mixing chamber. The latter employs a technology of cooling an object connected to a magnetic body using entropy change which occurs when aligning a spinning direction by applying a magnetic field to the magnetic body and removing the magnetic field. In both cases, the cold head 215 is installed at a position which is cooled the most.

In the case of stabilizing the temperature of the cold head 215 with the dilution refrigerator, once a target temperature is set to the temperature control unit 254, the temperature control unit 254 controls the output of the heater 210 on the basis of the temperature of the first thermometer 209. It is to be noted that, in the case of the ADR, the temperature of the cold head 215 is maintained constant by controlling the strength of the magnetic field applied to the magnetic body on the basis of the temperature of the first thermometer 209.

<Operation Principle of TES>

The TES 201 uses superconductive transition in the superconductor, and retains an operating point in an intermediate state between normal conductivity and superconductivity during an operation of detecting the radiation. When a single radiation is absorbed by the TES 201, in a state in which the operating point is retained during the superconductive transition, this allows for acquiring, for example, a change of a few mΩ in the resistance value with respect to 100 μK temperature variation, and acquiring a signal pulse on the order of ρA. Moreover, by calculating a relation between the energy of the radiation and the peak value of the signal pulse in advance, when a radiation having unknown energy enters the TES 201, it is possible to detect the energy of the incident radiation from the peak value of the signal pulse.

When having the TES 201 retained at the operating point during the superconductive transition, the operating point of the TES 201 is determined by a thermal balance between the current flowing through the TES 201 (hereinbelow, referred to as "TES current It") and a thermal link to the cold head 215. An energy resolution of the TES 201 is correlated with the temperature, and the temperature is preferably as low as possible. The temperature of the cold head 215 is left at, for example, about 50 mK-400 mK. The TES current It is determined by the following formula (1).

[Formula 1]

$$It^2 Rt(T) = G(T - Tb) \quad (1)$$

In the formula (1), the TES current It is described with a dynamic resistance Rt of the TES 201, a thermal conductivity G of the thermal link for thermally connecting the second thermometer 213 and the cold head 215 provided in the TES 201, a temperature T of the second thermometer 213, and a temperature Tb of the cold head 215. Here, the baseline current means the TES current It in a state where the TES 201 is not irradiated with the radiation.

Furthermore, a relation between the TES current It and the signal pulse ΔI is given by the following formula (2). Ideally, when the TES current It is constant, the always constant signal pulse ΔI is acquired.

[Formula 2]

$$It = \frac{CT}{\alpha E} \Delta I \quad (2)$$

In the formula (2), the TES current It and the signal pulse ΔI are described with a sensitivity α of the TES 201, a heat capacity C, an energy E of the radiation to be irradiated, and the temperature T of the second thermometer 213. As can be seen from the formula (2), when the baseline current flowing through the TES 201 changes, the signal pulse ΔI varies even if the TES 201 is irradiated with the radiation having the same energy. Moreover, as can be seen from the formula (1), the baseline current changes as the temperature of the cold head 215 changes. That is, when the temperature of the cold head 215 varies, the signal pulse ΔI varies.

The signal pulse ΔI when the TES 201 is irradiated with the radiation changes in the increasing direction with the increase of the current flowing through the SQUID amplifier 207 (equal to the TES current It) according to the above-described formula (2). The signal pulse ΔI is convoluted with the filter by the pulse height analyzer 251, and the peak value which is calculated therefrom is corrected by the correction unit 252 and transmitted to the spectrum generation unit 253. At this time, the spectrum is generated by the spectrum generation unit 253 in which the horizontal axis indicates the peak value and the vertical axis indicates the count. For example, when the peak value is 100, one is counted at a position of 100.

That the signal pulse varies despite irradiation with the radiation having the same energy means that the peak value fluctuates. The degree of this fluctuation is equivalent to the energy resolution described above. That is, in order to achieve a high energy resolution, it is required to reduce the fluctuation of the peak value with respect to the radiation having the same energy.

When the TES 201 is retained in the intermediate state between the normal conductivity and the superconductivity, Joule heat generated in the second thermometer 213 is thermally balanced with a heat flow flowing to the cold head 215 through the membrane 214. The thermal balance between the Joule heat and the heat flow is given by the above-described formula (1). Here, taking into account that the TES current It is affected by heat Pex from the outside of the TES 201, the above-described formula (1) is rewritten as the following formula (3).

[Formula 3]

$$It^2 Rt(T) + \left(V + \frac{GT}{I\alpha}\right)\delta It + Pex = G(T - Tb) \quad (3)$$

As the heat Pex from the outside of the TES 201 increases, δIt in the second term on the left side is reduced so as to satisfy the formula (3). That is, the baseline current varies as the heat Pex from the outside of the TES 201 varies, and the signal pulse ΔI varies as the baseline current varies. Since the peak value varies as its signal pulse ΔI varies, the energy resolution is degraded. Example variations of the heat Pex from the outside of the TES 201 include a temperature variation of the cold head 215 that cools the TES 201, a variation of heat radiation due to the temperature variation in the heat shield 217 surrounding the cold head 215, a variation of heat conduction from the heat shield 217 to the TES 201 due to residual gas present in the refrigerator 211, or the like.

<Operation of Radiation Analysis Subsystem>

Accordingly, the present embodiment employs the method of correcting the peak value as described below. In summary, the correction unit 252 acquires the baseline current and the peak value in a case of irradiation with radiation having predetermined energy (first energy) under at least two different temperature conditions, and stores them as the correlation data in advance (before starting the analysis). When analyzing the actual radiation (when the scanning electron microscope system 100 is in operation), the correction unit 252 measures the baseline current regularly flowing through the TES 201 immediately before the TES 201 detects the signal pulse. It is then possible to acquire an accurate peak value by correcting the peak value of the signal pulse using the correlation data between the baseline current and the peak value acquired in advance. It is to be noted that the correlation data only needs to be based on the baseline current and the peak value, and the baseline current and the energy value calculated from the peak value may be taken as the correlation data.

The baseline current has a statistical fluctuation because it is a current that regularly flows through the TES 201. Therefore, it is possible to average about 100 points of sampling data, for example, and to use the averaged value. As an example, it is possible to monitor a current value that is the output of the room temperature amplifier 208 using a 1 MS/sec analog-to-digital-converter (ADC), acquire multiple data at a 1 μsec sampling interval, and average them.

In the radiation analysis subsystem 200, by suppressing the variation of the baseline current during operation of the scanning electron microscope system 100 (during sample analysis) within ±2.0 μA, it is possible to make the variation of the measured radiation energy no higher than 1 eV, which is used as a bin width of the energy spectrum, and to constantly acquire a high energy resolution.

(Measurement Preparation: Acquisition of Correlation Data)

Figure 5:
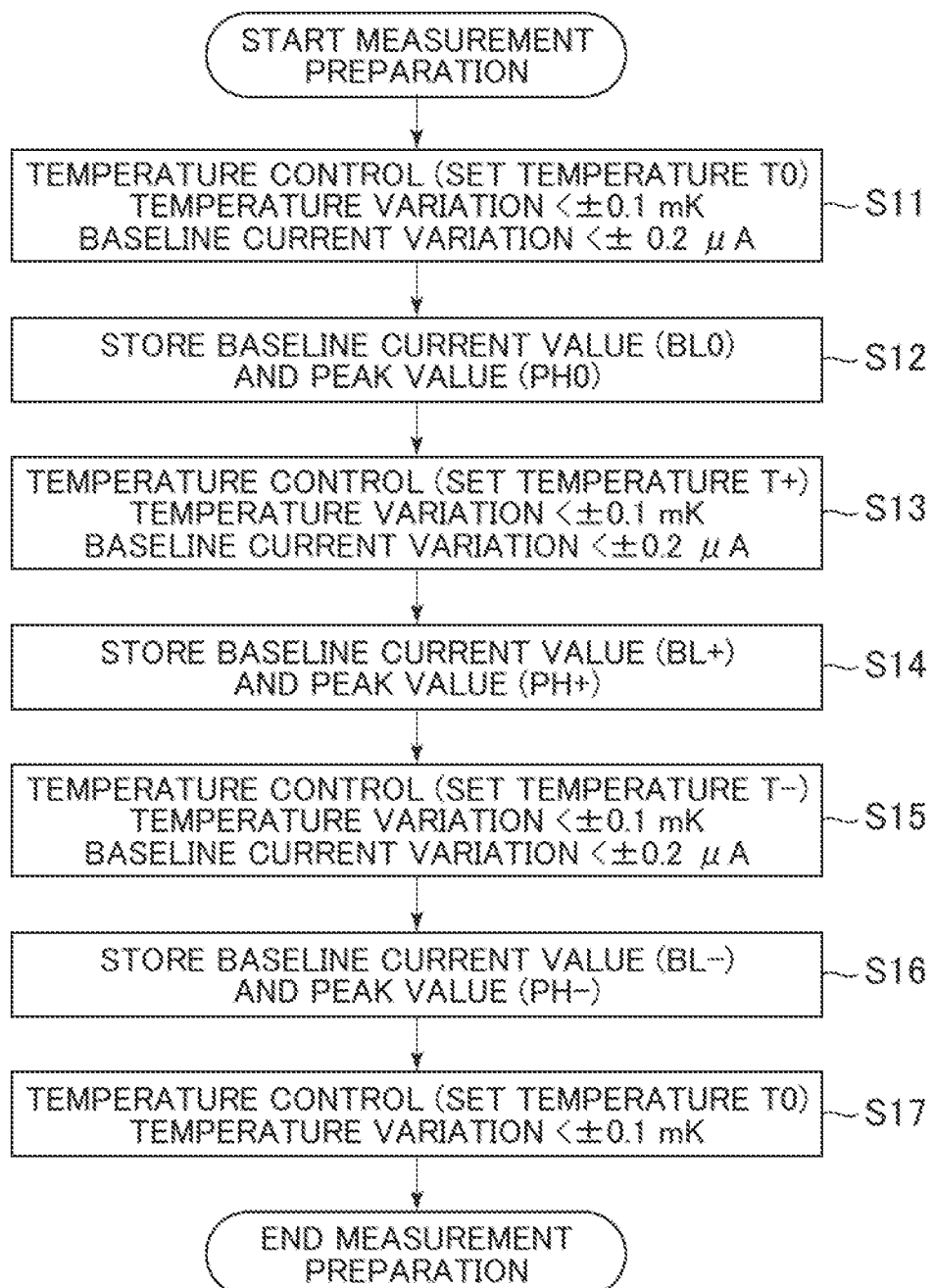
FIG. 5 is a flowchart showing a measurement preparation method by the radiation analyzer.

FIG. 5 is a flowchart showing a measurement preparation method by the radiation analysis subsystem 200. The aforementioned correlation data is acquired in this measurement preparation. Although the operation shown in FIG. 5 is in fact performed by the computer subsystem 250 executing a program to implement the function of each module, the description may be made below taking each module of the computer subsystem 250 as a subject of each operation.

During the measurement preparation, the TES 201 needs to be irradiated with the radiation having the same energy (energy E0 (first energy)). The energy of the radiation entering the TES 201 is determined by an element contained in the sample 306 placed on the sample stage 307 of the scanning electron microscope 300 shown in FIG. 1. Thus, the measurement preparation is performed using the sample 306 that allows for acquiring a radiation having the desired energy E0. Placed on the sample stage 307 may be, for example, a sample for the measurement preparation and a sample to be observed by the scanning electron microscope 300. The element to be irradiated with the electron beam 302 can be changed by moving the sample stage 307 in the X-Y direction using a sample containing multiple types of elements for the measurement preparation. Alternatively, the element to be irradiated with the electron beam 302 may be changed by scanning, with the electron beam 302, the sample for the measurement preparation containing multiple types of elements using the deflection scanning coil 304. As an example, in a case in which silicon is irradiated with the electron beam 302, a radiation having 1740 eV energy is generated.

First, the computer subsystem 250 confirms that the refrigerator 211 is sufficiently cooled on the basis of the temperature acquired by the first thermometer 209. The temperature control unit 254 then sets a reference set temperature to T0, and adjusts the output of the heater 210 on the basis of the temperature acquired by the first thermometer 209. After the temperature of the cold head 215 reaches T0, the output of the first thermometer 209 varies around the temperature T0.

At Step S11, the temperature control unit 254 confirms that the variation in temperature acquired by the first thermometer 209 is reduced to be smaller than ±0.1 mK, and the correction unit 252 confirms that the variation of the baseline current is reduced to be smaller than ±0.2 μA.

At Step S12, upon detecting the signal pulse due to irradiation with the radiation having the energy E0, the pulse height analyzer 251 calculates its peak value, and outputs the peak value to the correction unit 252 as a peak value PH0. The correction unit 252 stores the baseline current BL0 and the peak value PH0 at this time as the correlation data.

At Step S13, the temperature control unit 254 adjusts the output of the heater 210 by changing the set temperature to T+, and increases the temperature so that the baseline current flows about 2.0 μA more than BL0. The temperature control unit 254 confirms that the variation in temperature has become smaller than ±0.1 mK and the correction unit 252 confirms that the variation of the baseline current has become smaller than ±0.2 μA.

At Step S14, upon detecting the signal pulse due to irradiation with the radiation having the energy E0, the pulse height analyzer 251 calculates its peak value, and outputs the peak value to the correction unit 252 as a peak value PH+. The correction unit 252 stores the baseline current BL+ and the peak value PH+ at this time as the correlation data.

At Step S15, the temperature control unit 254 changes the set temperature to T−, adjusts the output of the heater 210, and reduces the temperature so that the baseline current flows about 2.0 μA less than BL0. The temperature control unit 254 confirms that the variation in temperature has become smaller than ±0.1 mK and the correction unit 252 confirms that the variation of the baseline current has become smaller than ±0.2 μA.

At Step S16, upon detecting the signal pulse due to irradiation with the radiation having the energy E0, the pulse height analyzer 251 calculates its peak value, and outputs the peak value to the correction unit 252 as a peak value PH−. The correction unit 252 stores the baseline current BL− and the peak value PH− at this time as the correlation data.

At Step S17, the temperature control unit 254 adjusts the output of the heater 210 so that the temperature is at a reference value T0. The temperature control unit 254 confirms that the variation in temperature has become smaller than ±0.1 mK. In this manner, the measurement preparation is completed, and analysis with a constantly high energy resolution is made possible.

Figure 6:
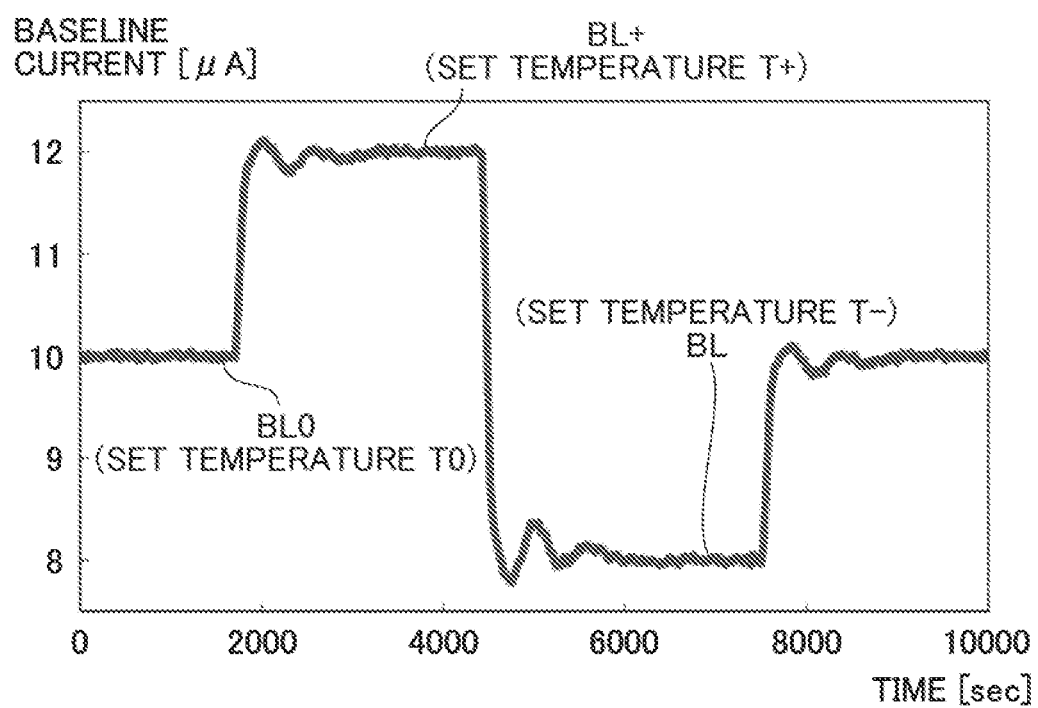
FIG. 6 is a graph showing a change in the baseline current from the start of measurement preparation until the end of the measurement preparation.

FIG. 6 is a graph showing a change in the baseline current from the start of the measurement preparation until the end of the measurement preparation. In FIG. 6, the horizontal axis indicates time and the vertical axis indicates the baseline current. In the example shown in FIG. 6, the baseline current BL0 at the set temperature T0 is 10 μA, the baseline current BL+ at the set temperature T+ is 12 μA, and the baseline current BL− at the set temperature T− is 8 μA. The graph shown in FIG. 6 can be displayed on the display unit or the computer subsystem 250 or on the display unit 507 of the computer subsystem 500.

Moreover, the display unit of the computer subsystem 250 can display a GUI screen for the user to input the energy E0 of the radiation, the set temperatures T0, T+, and T− of the temperature control unit 254 set in the aforementioned measurement preparation and for displaying the acquired correlation data.

Figure 7:
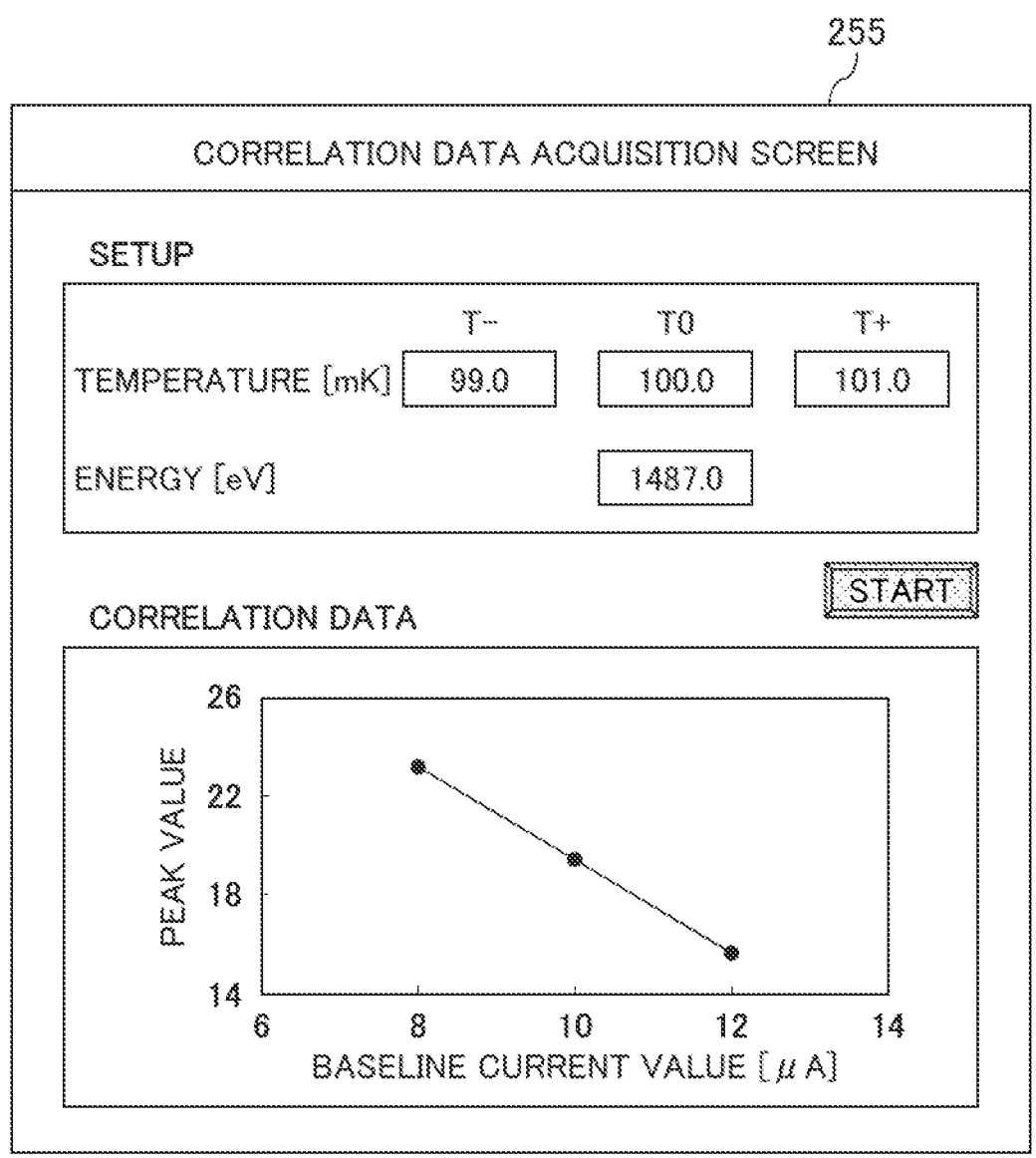
FIG. 7 is a schematic diagram showing a correlation data acquisition screen for the measurement preparation.

FIG. 7 is a schematic diagram showing a correlation data acquisition screen 255 (GUI screen) for the measurement preparation. As shown in FIG. 7, the correlation data acquisition screen 255 has an input box for a user to input three temperatures (T0, T+, T−) and the energy of the radiation (E0), for example. The correlation data acquisition screen 255 has a start button, and when the user clicks the start button, the computer subsystem 250 performs the measurement preparation in accordance with the flowchart shown in FIG. 5 and acquires the correlation data between the baseline current and the peak value. The computer subsystem 250 displays the obtained correlation data between the baseline current and the peak value on the correlation data acquisition screen 255. Since the correlation data acquisition screen 255 allows the user to confirm the correlation data between the baseline current and the peak value in this manner, the system is made user-friendly.

(Method of Correcting Peak Value when Analyzing Radiation)

Described below is a method of correcting the peak value when analyzing a radiation having unknown energy (second energy).

Figure 8:
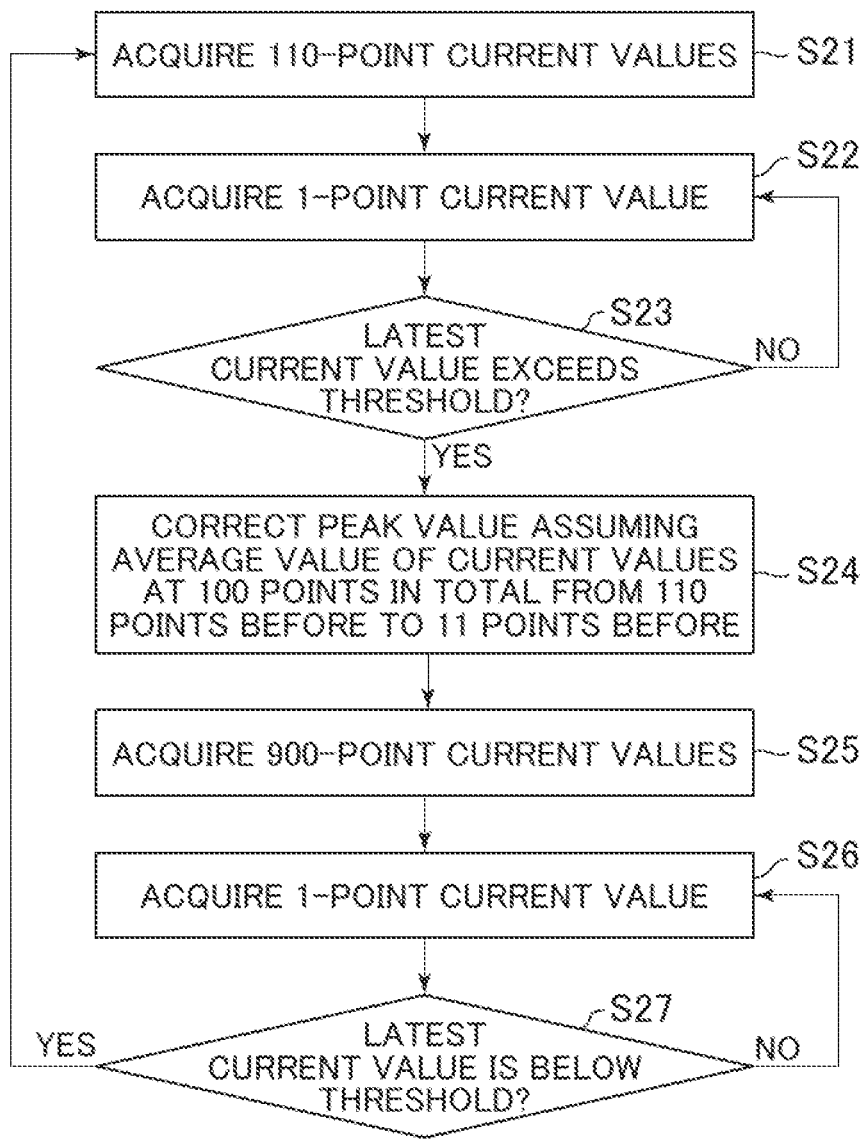
FIG. 8 is a flowchart showing a method of correcting a peak value by a correction unit.

FIG. 8 is a flowchart showing the method of correcting the peak value by the correction unit 252. As described above, the baseline current can be less affected by the fluctuation by averaging, for example, about 100 points of sampling data and using the averaged value. Accordingly, at Step S21, the correction unit 252 acquires one point of current value sampling data with respect to each ρsec, and acquires the current value sampling data to have 110 points in total.

At Step S22, the correction unit 252 acquires one point of the current value sampling data. At Step S23, the correction unit 252 determines whether the latest current value acquired at Step S22 exceeds a threshold and determines whether the signal pulse is detected. Steps S22 and S23 are repeated until the signal pulse is detected.

If the latest current value exceeds the threshold (Yes), the process proceeds to Step S24, where the correction unit 252 calculates the average value of the 100 current values in total from 110 points before to 11 points before the point that exceeded the threshold, the average value being regarded as the baseline current BL.

Figure 9:
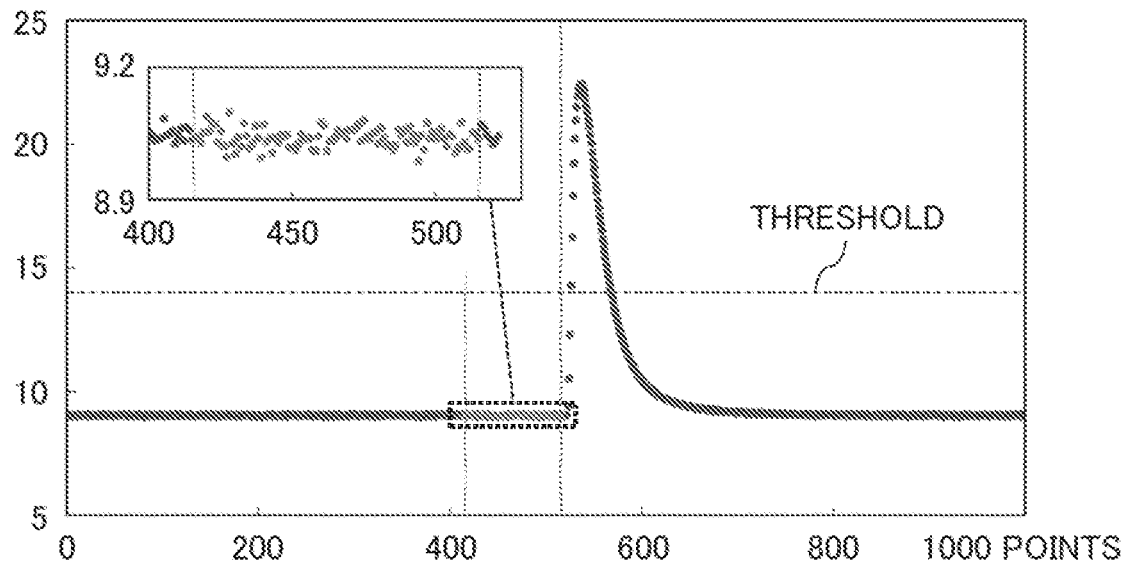
FIG. 9 is a graph showing a change in a current acquired by the correction unit.

FIG. 9 is a graph showing the change in the current acquired by the correction unit 252. In FIG. 9, the horizontal axis indicates a count of sampled points and the vertical axis indicates the baseline current. In the example shown in FIG. 9, the current value exceeds the threshold at the 526th point, and the baseline current BL is 9.042 μA taking an average value from the 416th point to the 515th point.

Returning to FIG. 8, the correction unit 252 corrects the peak value PH of the signal pulse due to the irradiation with the radiation having the unknown energy using the baseline current BL acquired at the same time and the correlation data acquired in advance by the method shown in FIG. 5. Specifically, an accurate peak value PH' after correction is calculated using the baseline current (BL0, BL+, BL−) acquired in the measurement preparation and the peak value (PH0, PH+, PH−) of the signal pulse of the radiation having the energy E0.

The correction unit 252 first calculates the peak value PH0' of the radiation having the energy E0 when the baseline current is BL using the following formula (4). The correction unit 252 then calculates the peak value PH' after the correction using a relation in which a proportion of the peak value PH and the peak value PH0' is equal to a proportion of the peak value PH' and the peak value PH0 using the following formula (5). The correction unit 252 or the spectrum generation unit 253 can acquire a value of the unknown energy by converting the peak value PH' after the correction to the energy.

[Formula 4]

$$PH0' = \begin{cases} PH0 + \dfrac{PH^+ - PH0}{BL^+ - BL0} \times (BL - BL0) & (BL \geq BL0) \\ PH0 - \dfrac{PH0 - PH-}{BL0 - BL-} \times (BL0 - BL) & (BL < BL0) \end{cases} \quad (4)$$

[Formula 5]

$$PH' = \dfrac{PH0}{PH0'} \times PH \quad (5)$$

Figure 10:
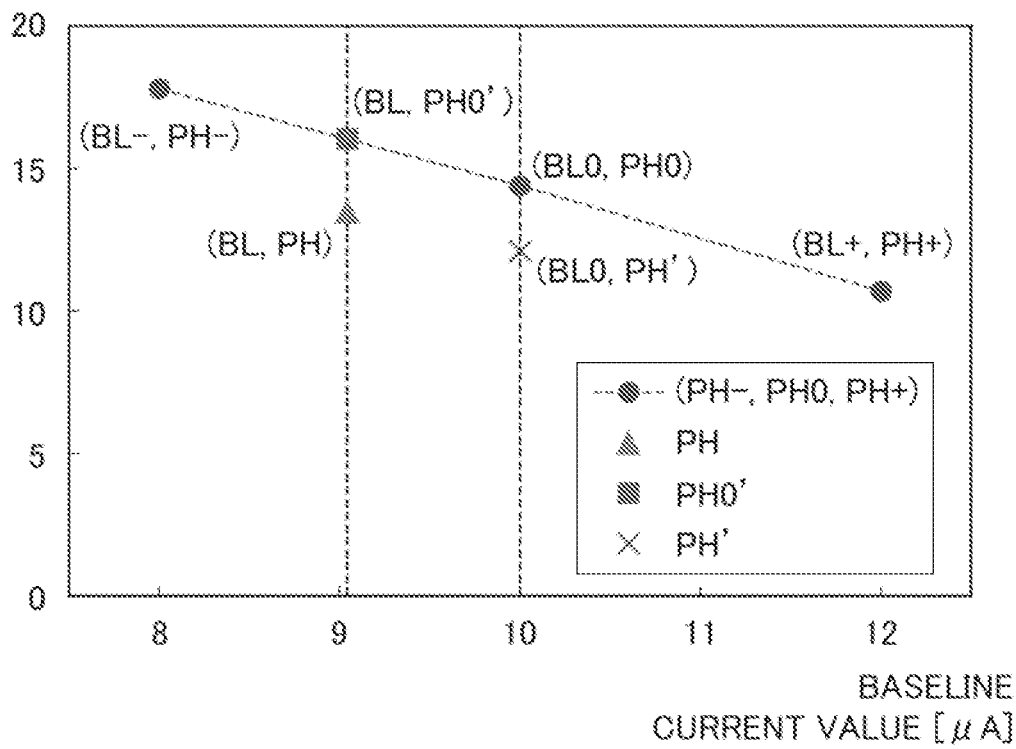
FIG. 10 shows correlation data between the baseline current and the peak value of the radiation analyzer.

FIG. 10 shows an example of the correlation data between the baseline current and the peak value of the signal pulse of the radiation having the energy E0, and a relation among PH0, PH0', PH, and PH'. In FIG. 10, the horizontal axis indicates the baseline current and the vertical axis indicates the peak value. As shown in FIG. 10, although the correlation data is an approximate calculated with three points of data, there may be at least two points of data for acquiring the correlation data. It is to be noted that, as described above, when the energy calculated from the peak value (PH0, PH+, PH−) and the peak value (PH0, PH+, PH−) is used as the correlation data, at Step S24, the correction unit 252 can acquire the energy value after the correction by correcting the value of the energy calculated from the peak value PH.

Returning to FIG. 8, at Step S25, the correction unit 252 acquires, for example, 900 points of the current value sampling data to wait until the current flowing through the TES 201 returns to its static state.

At Step S26, the correction unit 252 acquires one point of the current value sampling data. At Step S27, the correction unit 252 determines whether the latest current value is lower than the threshold. Steps S26 and S27 are repeated until the latest current value becomes lower than the threshold.

When it is determined at Step S27 that the latest current value is lower than the threshold (Yes), the process returns to Step S21 and performs the same process as described above.

The method of correcting the peak value according to the present embodiment as described above is applicable when the energy of the radiation entering the TES 201 is proportional to the peak value of the signal pulse of the TES 201.

Figure 11:
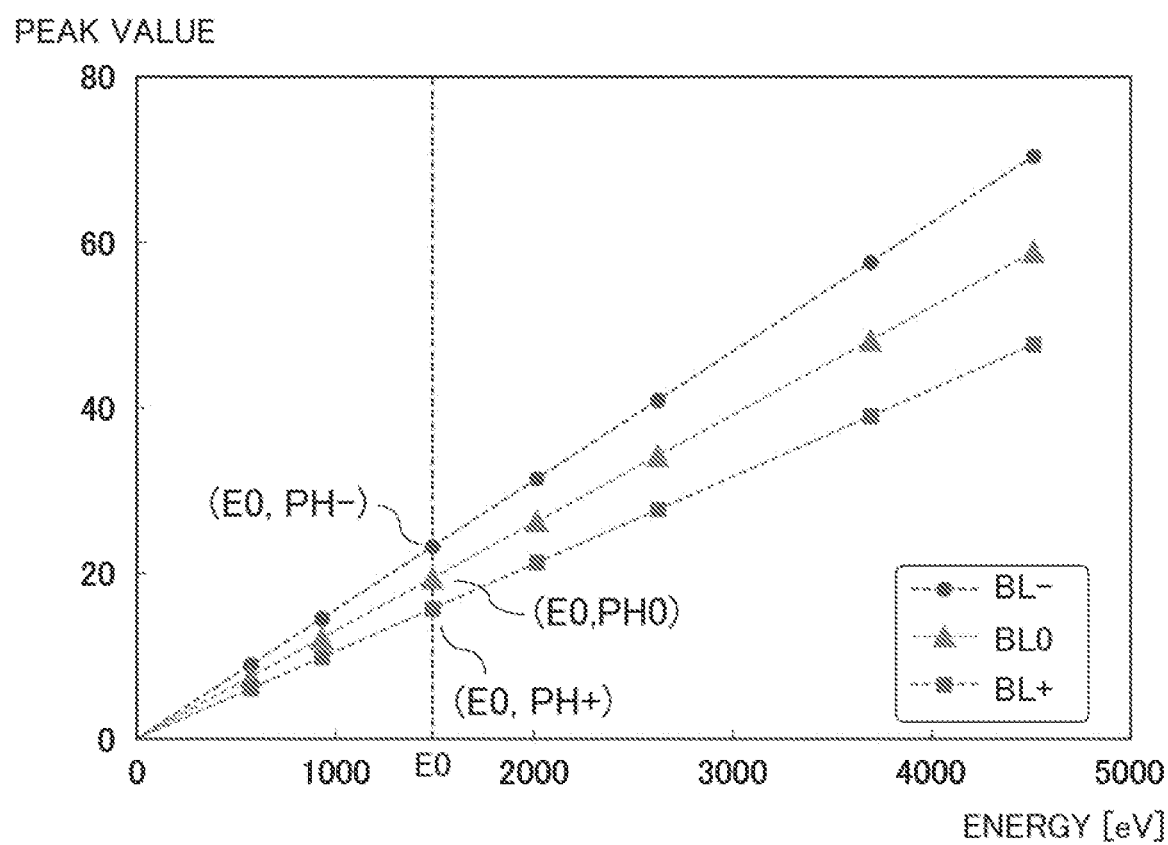
FIG. 11 shows the correlation data when energy of a radiation entering the TES of the radiation analyzer is proportional to the peak value.

FIG. 11 is a graph showing an example of the correlation data when the energy of the radiation entering the TES 201 is proportional to the peak value. In FIG. 11, the horizontal axis indicates the energy of the radiation and the vertical axis indicates the peak value. As shown in FIG. 11, when the energy of the radiation is proportional to the peak value, the proportion among the peak values PH0, PH+, and PH− of the signal pulse stays constant regardless of the energy value. Accordingly, it is possible to acquire the correlation data using any one radiation having the energy E0, and to calculate the peak value PH' after the correction as described above using the formulas (4) and (5).

<Technical Effect>

As described above, the radiation analysis subsystem 200 according to the present embodiment corrects the peak value in accordance with the baseline current flowing through the TES 201 immediately before the peak value is measured by the pulse height analyzer 251 at the time of actual analysis, using the correlation data based on the baseline current and the peak value acquired in advance. Since this makes it possible to acquire a constant peak value with respect to the radiation having the same energy regardless of the variation of the baseline current without acquiring the additional correction data, it is possible to constantly acquire a high energy resolution.

Second Embodiment

In the first embodiment, the technology was described to correct the peak value on the basis of the fact that the energy of the radiation entering the TES 201 is proportional to the peak value of the signal pulse of the TES 201. However, in an actual radiation analyzer, the energy of the radiation may not be proportional to the peak value of the signal pulse. Even in such a case, it is possible to acquire an accurate peak value by acquiring the correlation data based on the energy of the radiation and the peak value of the signal pulse in advance. Accordingly, proposed in a second embodiment is an operation of the radiation analysis subsystem in a case in which the energy of the radiation is not proportional to the peak value.

A configuration of the radiation analysis subsystem in the present embodiment can be the same as the configuration in the first embodiment, and therefore description thereof is omitted.

<Operation of Radiation Analysis Subsystem>
(Measurement Preparation: Acquisition of Correlation Data)

Figure 12:
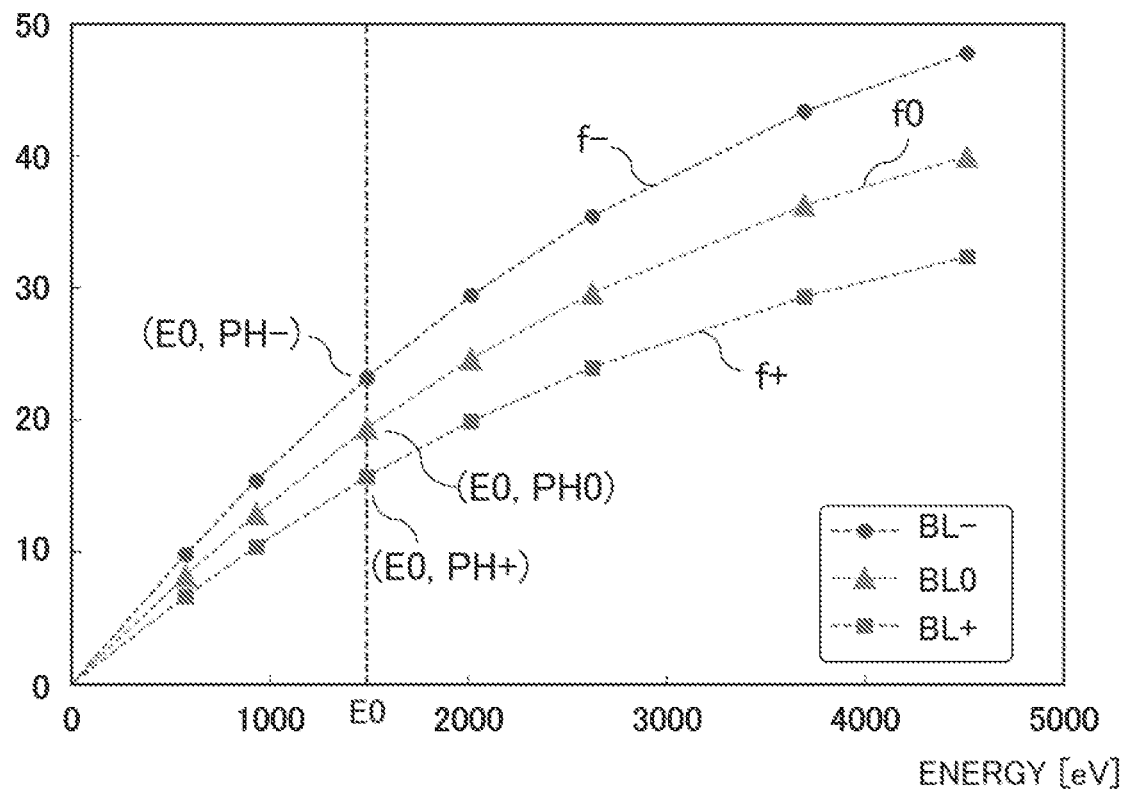
FIG. 12 shows the correlation data when the energy of the radiation entering the TES of the radiation analyzer is not proportional to the peak value.

FIG. 12 is a graph showing an example of the correlation data when the energy of the radiation entering the TES 201 is not proportional to the peak value. In FIG. 12, the horizontal axis indicates the energy of the radiation and the vertical axis indicates the peak value. As shown in FIG. 12, when the energy of the radiation is not proportional to the peak value, it is required to acquire the correlation data using radiations having two or more energies.

The method of acquiring the correlation data according to the present embodiment is substantially the same as in the first embodiment (flowchart in FIG. 5) except the following points. That is, when acquiring the peak value (PH0, PH+, PH−) at the time of acquiring the correlation data (Steps S12, S14, and S16), the pulse height analyzer 251 detects the signal pulse corresponding to the two or more radiation energies, and the correction unit 252 stores the peak value. The energy of the radiation can be changed by changing the sample 306 (element) to be irradiated with the electron beam 302 by moving the sample stage 307 of the scanning electron microscope 300 shown in FIG. 1 or scanning the scanning coil 304. Moreover, the correction unit 252 creates a correction curve (function f0, f+, f−) of the data including the acquired radiation energy and the peak value interpolated by an n-order function (n is an integer) or a spline curve, and stores the correction curve as the correlation data.

Figure 13:
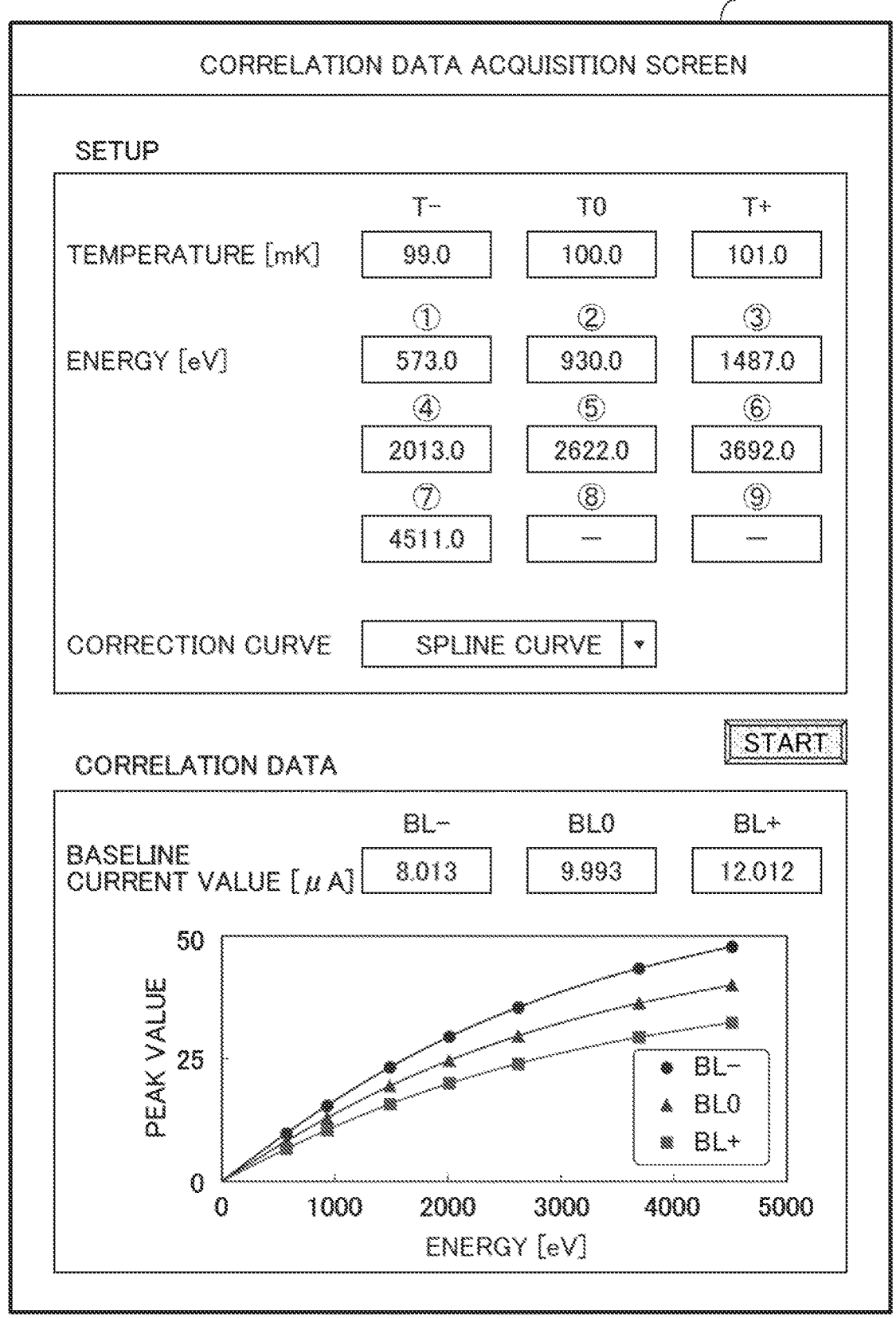
FIG. 13 shows a correlation data acquisition screen for acquiring correlation data according to a second embodiment.

FIG. 13 shows a correlation data acquisition screen 256 (GUI screen) for acquiring correlation data according to the second embodiment. As shown in FIG. 13, the correlation data acquisition screen 256 is a GUI screen for acquiring the baseline current and the correlation data between the radiation energy and the peak value, and has an input box to input three temperatures (T0, T+, T−), two or more radiation energies, and an interpolation method, for example.

For example, up to about 20 radiation energies can be set. The correlation data acquisition screen 256 shown in FIG. 13 is configured so that nine energies can be set. Moreover, as the interpolation method, for example, either the n-order function (n is an integer) or the spline curve can be selected. The correlation data acquisition screen 256 is provided with the start button, and when the user clicks the start button, the computer subsystem 250 performs the measurement preparation in accordance with the flowchart shown in FIG. 5, and stores the data of the baseline current and the peak values corresponding to all the radiation energies. The computer subsystem 250 then creates the correction curve of the radiation energy and the peak value and stores the correction curve as the correlation data. The computer subsystem 250 displays the acquired baseline current as well as the correlation data of the radiation energy and the peak value at each baseline current on the correlation data acquisition screen 256.

(Method of Correcting Peak Value when Analyzing Radiation)

The method of acquiring the correlation data according to the present embodiment is substantially the same as in the first embodiment (flowchart in FIG. 8) except Step S24 in the following points.

The correction unit 252 corrects the peak value PH of the signal pulse of the radiation having the unknown energy E (second energy) measured by the pulse height analyzer 251 in the following manner using the baseline current BL measured at the same time and the correlation data. Specifically, the accurate peak value PH' after the correction is calculated using the baseline current (BL0, BL+, BL−) acquired in the measurement preparation and the correction curve of the radiation energy and the peak value at each baseline current (function f0, f+, f−). At this time, the relation between the unknown energy E and the peak value PH is given by the following formula (6). The correction unit 252 then calculates the peak value PH' after the correction using an inverse function of the correction curve using the following formula (7).

[Formula 6]

$$E = \begin{cases} f^+(PH) & (BL = BL^+) \\ f0(PH) & (BL = BL0) \\ f\text{-}(PH) & (BL = BL\text{-}) \end{cases} \quad (6)$$

[Formula 7]

$$PH' = \begin{cases} f0^{-1}\left(f0(PH) + \dfrac{f^+(PH) - f0(PH)}{BL^+ - BL0} \times (BL - BL0)\right) & (BL \geq BL0) \\ f0^{-1}\left(f0(PH) - \dfrac{f0(PH) - f\text{-}(PH)}{BL0 - BL\text{-}} \times (BL0 - BL)\right) & (BL < BL0) \end{cases} \quad (7)$$

In the formula (7), the expression in parentheses after $f0^{-1}$ indicates that, when a single radiation is detected, an energy value of the radiation can be calculated from the peak value of the pulse and the baseline current. The formula (7) is for calculating an accurate peak value PH' after the correction by using an inverse function of the energy value.

<Technical Effect>

As described above, the radiation analysis subsystem according to the second embodiment acquires the peak values at 254 confirms least two baseline currents with respect to each energy value using radiations having at least two known energy values, thereby acquiring the correlation data (correction curve) of the peak value and the energy value. This correlation data is used to correct the peak value in accordance with the baseline current flowing through the TES immediately before the peak value is measured by the pulse height analyzer. This makes it possible to acquire a constant peak value with respect to the radiation having the same energy regardless of the variation of the baseline current without acquiring the additional correction data, and therefore it is possible to constantly acquire a high energy resolution.

Modification

The present disclosure is not limited to the aforementioned embodiments but may include various modifications. For example, the aforementioned embodiments are described in detail for easy comprehension of the present disclosure, and the invention does not necessarily include all the configurations described herein. A part of one embodiment may be replaced by a configuration of another embodiment. A configuration of one embodiment may also be added to a configuration of another embodiment. Moreover, a part of a configuration of one embodiment may be added to, deleted from, or replaced by a part of a configuration of another embodiment.

It is needless to say that, although each configuration, function, control unit, or the like described above is described focusing on an example of creating a program for implementing a part or all thereof, the part or all may be implemented on a hardware by designing an integrated circuit, for example. That is, all or a part of the function of the control unit may be implemented by an integrated circuit such as an ASIC (Application Specific Integrated Circuit), an FPGA (Field Programmable Gate Array), and the like, for example, instead of the program.

LIST OF REFERENCE SIGNS

100: Scanning electron microscope system
200: Radiation analysis subsystem
201: TES
202: Sensor circuit unit
203: Bias current source
204: Shunt resistor
205: Input coil
206: Current detection mechanism
207: SQUID amplifier
208: Room temperature amplifier
209: First thermometer
210: Heater
211: Refrigerator
212: Absorber
213: Second thermometer
214: Membrane
215: Cold head
216: Superconductive wiring
217: Heat shield
250: Computer subsystem
251: Pulse height analyzer
252: Correction unit
253: Spectrum generation unit
254: Temperature control unit
255, 256: Correlation data acquisition screen
300: Scanning electron microscope
301: Electron source
302: Electron beam
303: Condenser lens
304: Deflection scanning coil
305: Objective lens
306: Sample
307: Sample stage
308: Backscattered electron detector
309: Secondary electron detector
400: High voltage power supply
500: Computer subsystem
501: Total control unit
502: Electron optical system control unit
503: Stage control unit
504: A/D conversion unit
505: Image operation unit
506: Storage device
507: Display unit
508: Input device

The invention claimed is:

1. A radiation analysis system comprising:
a superconductive transition edge sensor that detects a radiation;
a current detection mechanism that detects a current flowing through the superconductive transition edge sensor; and
a computer subsystem that processes a detection signal of the current from the current detection mechanism,
wherein the computer subsystem performs
a process of calculating a baseline current of the detection signal of the current, a process of calculating a peak value of a signal pulse generated in the detection signal when the superconductive transition edge sensor detects the radiation, a process of acquiring correlation data based on the baseline current and the peak value when a radiation having at least a first energy is detected by the superconductive transition edge sensor under two or more different temperature conditions, and a process of correcting the peak value of the signal pulse or an energy value calculated from the peak value on the basis of the baseline current before the signal pulse is generated when a radiation having unknown energy is detected by the superconductive transition edge sensor and the correlation data.

2. The radiation analysis system according to claim 1, wherein the computer subsystem further performs calculating the unknown energy on the basis of the corrected peak value.

3. The radiation analysis system according to claim 1, wherein, in the process of acquiring the correlation data, the computer subsystem acquires the correlation data based on the baseline current and the peak value when a radiation having multiple energies is detected by the superconductive transition edge sensor respectively under the two or more different temperature conditions.

4. The radiation analysis system according to claim 1, further comprising:

a cold head for cooling the superconductive transition edge sensor; and a heater provided to the cold head.

5. The radiation analysis system according to claim 4, wherein the computer subsystem further performs a process of controlling an output of the heater.

6. The radiation analysis system according to claim 5, wherein, in the process of acquiring the correlation data, the computer subsystem controls the output of the heater so that a temperature variation in the cold head is equal to or smaller than ±0.1 mK.

7. The radiation analysis system according to claim 6, wherein, in the process of acquiring the correlation data, the computer subsystem controls the output of the heater so that a variation of the baseline current is equal to or smaller than ±0.2 µA.

8. The radiation analysis system according to claim 5, wherein the computer subsystem controls the output of the heater so that a variation of the baseline current is equal to or smaller than ±2.0 µA.

9. The radiation analysis system according to claim 1, wherein the computer subsystem comprises a display unit, and wherein the computer subsystem displays a GUI screen for acquiring the correlation data on the display unit.

10. The radiation analysis system according to claim 1, wherein the current detection mechanism comprises a superconducting quantum interference device amplifier, and a room temperature amplifier for amplifying and forming an electric signal output from the superconducting quantum interference device amplifier.

11. A charged particle beam system comprising a radiation analysis system according to claim 1.

12. A radiation analysis method comprising:

detecting a radiation by a superconductive transition edge sensor;

detecting a current flowing through the superconductive transition edge sensor by a current detection mechanism;

processing a detection signal of the current from the current detection mechanism;

calculating a baseline current of the current by a computer system;

calculating, by the computer system, a peak value of a signal pulse generated in the detection signal when the superconductive transition edge sensor detects the radiation;

acquiring, by the computer system, correlation data based on the baseline current and the peak value when a radiation having at least a first energy is detected by the superconductive transition edge sensor under two or more different temperature conditions, and correcting, by the computer system, the peak value of the signal pulse or an energy value calculated from the peak value on the basis of the baseline current before the signal pulse is generated when a radiation having unknown energy is detected by the superconductive transition edge sensor and the correlation data.

13. A radiation analysis system comprising:

a superconductive transition edge sensor that detects a radiation;

a current detection mechanism that detects a current flowing through the superconductive transition edge sensor; and a computer subsystem that processes a detection signal of the current from the current detection mechanism, wherein the computer subsystem comprises a storage device that stores therein correlation data based on a baseline current and a peak value when a radiation having at least a first energy is detected by the superconductive transition edge sensor under two or more different temperature conditions, and wherein the computer subsystem performs a process of calculating a baseline current of the detection signal of the current, a process of calculating a peak value of a signal pulse generated in the detection signal when the superconductive transition edge sensor detects the radiation, and a process of correcting the peak value of the signal pulse or an energy value calculated from the peak value on the basis of the baseline current before the signal pulse is generated when a radiation having unknown energy is detected by the superconductive transition edge sensor and the correlation data.

14. A radiation analysis system comprising:

a superconductive transition edge sensor that detects a radiation;

a current detection mechanism that detects a current flowing through the superconductive transition edge sensor; and a computer subsystem that processes a detection signal of the current from the current detection mechanism, wherein the computer subsystem performs a process of calculating a baseline current of the detection signal of the current, a process of calculating a peak value of a signal pulse generated in the detection signal when the superconductive transition edge sensor detects the radiation, a process of acquiring correlation data based on the baseline current and the peak value, and a process of calculating, if the baseline current before the signal pulse is generated when a radiation having unknown energy is detected by the superconductive transition edge sensor exceeds a threshold, an average value of the baseline currents from before a first point to a second point before a point that exceeds the threshold, and correcting the peak value of the signal pulse or an energy value calculated from the peak value on the basis of the average value of the baseline currents and the correlation data.

\* \* \* \* \*